United States Patent [19]

Hirz et al.

[11] Patent Number: 5,310,627
[45] Date of Patent: May 10, 1994

[54] CHANGING THE COLOR OF YELLOW RESIST IMAGES BY APPLICATION OF PH-SENSITIVE DYES

[75] Inventors: Suzan J. Hirz, Maplewood; Bruce W. Weeks, Lake Elmo, both of Minn.

[73] Assignee: Minnesota Mining and Manufacturing Company, St. Paul, Minn.

[21] Appl. No.: 990,469

[22] Filed: Dec. 15, 1992

[51] Int. Cl.$^5$ .......................... G03C 7/00; G03C 5/00; G03C 5/18; G03F 9/00

[52] U.S. Cl. .................................... 430/359; 430/22; 430/143; 430/291; 430/292; 430/293; 430/373; 8/906; 101/486; 106/19 A; 106/20 A; 106/21 A

[58] Field of Search .................. 430/22, 292, 293, 359, 430/373, 291, 143; 8/506; 427/282; 101/486, DIG. 29; 106/19 A, 20 A, 21 A; 434/84, 324, 408

[56] References Cited

U.S. PATENT DOCUMENTS

| | | | |
|---|---|---|---|
| 3,451,143 | 6/1969 | Thomas et al. | 35/9 |
| 3,617,325 | 11/1971 | Spokes et al. | 117/1.7 |
| 3,672,842 | 6/1972 | Florin | 23/230 R |
| 4,139,965 | 2/1979 | Curry et al. | 46/1 R |
| 4,188,431 | 2/1980 | Sokol et al. | 106/21 A |
| 4,246,033 | 1/1981 | von Wartburg | 106/23 |
| 4,744,826 | 5/1988 | Iijima | 106/19 A |
| 4,777,111 | 10/1988 | Blumel et al. | 430/293 |
| 4,869,996 | 9/1989 | McCartin et al. | 430/291 |
| 5,017,226 | 5/1991 | Kulisz | 106/19 A |

FOREIGN PATENT DOCUMENTS

| | | | |
|---|---|---|---|
| 0032653 | 7/1981 | European Pat. Off. | 106/20 A |
| 0211621 | 2/1987 | European Pat. Off. | 106/20 A |
| 2015829 | 10/1971 | Fed. Rep. of Germany | 106/21 A |
| 0145169 | 9/1982 | Japan | 106/20 A |
| 0161469 | 9/1984 | Japan | 106/21 A |
| 1350930 | 4/1974 | United Kingdom . | |
| 2225031 | 5/1990 | United Kingdom | 8/506 |

*Primary Examiner*—Charles L. Bowers, Jr.
*Assistant Examiner*—J. Pasterczyk
*Attorney, Agent, or Firm*—Gary L. Griswold; Walter N. Kirn; Mark A. Litman

[57] ABSTRACT

A method for locally enhancing the contrast of a yellow image, which method comprises providing a yellow image on a white background, said image comprised of yellow areas and white areas, said yellow areas and white areas exhibiting pH levels which differ by at least 0.5 in an aqueous environment, applying to at least a portion of said yellow image a solution of a pH color changing dye which will change color to a color other than yellow when coated on one of said yellow areas or white areas and not change color when coated on the other of said yellow areas or white areas, thereby forming a colored image duplicating the yellow image in areas where the solution has been applied, said colored image having a visually better contrast than said yellow image.

19 Claims, No Drawings

CHANGING THE COLOR OF YELLOW RESIST IMAGES BY APPLICATION OF PH-SENSITIVE DYES

BACKGROUND OF THE INVENTION

1. Field of the Invention

The present invention relates to resist imaging, particularly to color resist imaging useful in prepress color proofing.

2. Background of the Art

In many forms of color imaging, it is necessary to use more than one color to provide a final color rendition of an image. In the area of printing technology, most images are produced from cyan, magenta, yellow and black images which are laid down in sequence and in register. These four colors (or only cyan, yellow, and magenta) can be combined to provide the effect of most visible colors.

In laying down the images of these three or four colors, not only do the individual color images have to contain the proper color densities, but the separate images must be in register with each other in order for the correct image to appear in the reproduction. Both in printing and in color prepress proofing, marks are placed on the receptor sheet outside of the field of the printing to assist in placing the different color images into register. These marks are known in the trade as registration marks. By having the marks in the identical portion of the field to be imaged (but outside the field of the desired image), each successive color image can be placed in good registration with the previous images. Each registration mark is printed in the same color as the overall color of the individually printed color layer; that is, the registration mark for the cyan layer is cyan, for the yellow layer it is yellow, and for the magenta layer it is magenta. The color must be the same as the registration mark is printed at the same time and with the same imaging material (e.g., ink or transferred mass) as is the major portion of the image.

Most images are placed onto a white or near white (e.g., bone or ivory) receptor sheet such as paper. The registration marks for the cyan and magenta layers are quite readily visible on a white background, but yellow does not readily provide a clearly visible contrast against a white background. This poorly contrasting yellow image will not provide a good registration mark because it cannot be readily seen by the printer. If the mark cannot be clearly seen, it becomes difficult to place any successive images in register with the yellow image. It is not reasonable to place a different color on the area of the registration mark as this would probably have to be done manually on each image.

A technique must be developed for providing better contrasting registration marks on printed or proofing yellow registration marks.

SUMMARY OF THE INVENTION

Certain images provide not only a contrast in visible absorption and reflection when printed on a substrate, but also provide a difference in physical properties between colored and uncolored areas. In particular, certain systems, and especially certain resistively imaged elements provide colored and background areas which differ in their pH by measurable amounts. When the image is a yellow image in one of these systems which provide a pH differential, it has been found that the application of a solution having a pH indicating dye therein on the yellow image will provide a higher contrasting image between the colored and background areas because of a color change in the dye effected by the differences in pH.

If the dye is colorless at higher pH levels and colored at lower pH levels, the application of a solution of this dye to an image with differential pH surface areas will produce a color change in the lower pH area of the image. Conversely, if the dye is colored only at higher pH levels, the pH indicating dye will darken only in the areas of higher pH. When such a dye solution is provided over the registration mark of a yellow printed image, a much more readily visible image can be provided if the indicating dye does not produce only a yellow color upon a change of pH. As the indicator dye is placed on the registration mark (as with a brush, pen, or wipe) which is outside the field of the image, the difference in colors and contrast does not affect the quality of the image, but only enhances the visibility of the registration mark.

DETAILED DESCRIPTION OF THE INVENTION

In color reproduction, it is often necessary to verify the color accuracy of separation negatives used in the printing process. The use of overlay and surprint proofing systems for this application is well known in the literature. Surprint proofing systems have by far received the most acceptance for applications where color assessment is critical. A surprint proof is generated by successively superimposing different colored layers upon each other on a single sheet. The surprint color proofing materials are composed of two primary types: photosensitive precolored sheets and photosensitive colorless sheets whose latent tacky or electrostatic image may be toned with pigments, inks or dyes. Some examples of post-colored proofing materials may be found in U.S. Pat. Nos. 3,060,024; 3,634,087; 3,649,268; 4,174,216; 4,294,909; 4,356,252; 4,600,669; 4,734,356; 4,869,996; DE 3,336,431 A1 and EP 319,098 patent applications. In these systems the image is colored with wet or dry pigment dispersions. In the application of dry powder toners, the dust can be a nuisance and could potentially be hazardous if inhaled, especially when it is applied manually. The liquid toners are typically dispersed in solvents such as Isopar ™ which has a pungent odor and is considered combustible making the toner difficult to store and dispose of. Since the solvent must be evaporated to form a dry image, a solvent recovery unit may be necessary if regulated governmental agency limitations of permissible volatile organic components is exceeded. Attempts to eliminate these disadvantages are described in U.S. Pat. No. 4,806,451 and EP 365,361 A2 patent application, which describe the process of laminating a precolored sheet to the colorless image and then peeling it apart to produce the colored image. Other dry peel apart systems which incorporate the color layer with the photoactive layer include; U.S. Pat. Nos. 4,923,780; 4,987,051; 4,895,787; 4,910,120; 4,963,462; GB 2,213,950 A, EP 385,466 A2, EP 365,362 A2, and EP 313,191 A2 patent applications. To date, these systems do not provide the image quality which can be achieved by other methods, especially for negative systems.

Other examples of precolored proofing materials include constructions based upon both diazo oxides and photopolymers as the photosensitive element. In U.S.

Pat. No. 4,482,625 and U.S. Pat. No. 4,304,836 two different precolored photopolymer constructions are described which are imaged prior to lamination to the substrate or intermediate sheet. A similar system is described in GB 2,144,867 A which utilizes precolored films sensitized with diazo based polymers. These systems require the imaged films to be laminated in register which is very dependent upon laminating speed, laminating temperature, and dimensional stability of the film and substrate. The accuracy of the registration is limited to smaller format proofs due to the difficulty in retaining perfect alignment of images during the thermal lamination process. This type of system also makes it very difficult to produce several small proofs on a single large sheet (scatter proofing).

U.S. Pat. No. 4,260,673 describes a positive acting presensitized color proofing sheet comprising a carrier sheet having a smooth release surface, diazo oxide sensitized color layer, a diazo oxide photoactive barrier layer and a thermal adhesive. The photoactive barrier layer is soluble in the developing media when exposed to light and provides a means of reducing interaction between the color layer and adhesive. U.S. Pat. Nos. 4,659,642; 4,772,533; and 4,948,693 describe improvements on this construction by eliminating the barrier layer. However, an aqueous highly alkali developer with pH ranges between 12 and 13 are still necessary for good development.

U.S. Pat. No. 3,671,236 describes a negative acting presensitized color proofing sheet comprising of a carrier sheet having a smooth release surface, a diazo sensitized color layer and a nonphotoactive barrier layer upon which may be coated a pressure sensitive adhesive or a thermal adhesive as described in U.S. Pat. No. 4,656,114. The developing media for this system is a 50:50 mixture of n-propyl alcohol and water. The barrier layer is present as a carrier for the image and to reduce interaction between the adhesive and the photoactive layer. U.S. Pat. Nos. 4,650,738; 4,751,166; 4,808,508; 4,929,532; and 5,008,174; EP 365,356 A and EP 365,357 A2 patent applications describe improvements on this construction by eliminating the need for a barrier layer between the diazo based photoactive layer and the adhesive. The developers used in these systems are aqueous alkali solutions containing greater than 3% surfactant. U.S. Pat. No. 4,596,757 discloses a further improvement on the construction described in U.S. Pat. No. 3,671,236 utilizing a photo monomer system in place of the diazonium binders. Again an aqueous alkali developer is used which contains high concentrations of a surfactant (the example cited used 8.5%). The present invention improves upon the above mentioned constructions by utilizing a photoactive color layer containing a photo-oligomer as the photopolymerizable component and a photopolymerizable barrier layer to provide a proofing element which can be developed in a low solids aqueous developer having a pH of 10.2. This construction allows one to develop the image using a more environmentally compatible effluent since the aqueous developer contains less caustic and less ingredients than those used in the previously described systems.

The preferred imaging system for use with the registration mark enhancing system of the present invention is described in U.S. patent application Ser. No. 07/752,771, U.S. Pat. No. 5,248,583 filed on Aug. 30, 1991 in the names of Wallace R. Lundquist, Thomas P. Klun, Michael B. Heller, and Leonard W. Sachi bearing Attorney's Docket No. 47593USA4A. That system is a pre-sensitized colored film comprising a support, an oxygen barrier layer which also serves as a release layer, a photosensitive color layer containing a multifunctional acrylate oligomer, a photopolymerizable barrier layer, and a non-blocking thermoplastic adhesive layer. When that sheet is imaged, it provides an image which has a significantly different pH than the removed background areas. It has been found that the application of indicator dyes to that image can provide significantly enhanced contrast to a yellow image.

The construction and use of that element is as follows. In the preferred embodiment, the carrier is composed of a dimensionally and chemically stable base material which is known in the art. One preferred material for use in the present invention is a 0.002 inch (0.051 mm) (2 mil) thick polyester film which may have a smooth or textured (matte) surface.

The carrier must have a release surface whose function is to serve as a parting layer between the carrier sheet and the photosensitive color layer. If the photosensitive color layer is sensitive to oxygen quenching during the exposure process, then an oxygen barrier layer is necessary. This oxygen barrier can function as both a barrier for oxygen and as a release layer. The oxygen barrier/release layer releases from the carrier and clings to the photosensitive color layer after lamination to a receiver and subsequent removal of the carrier. The release layer is coated onto the carrier using an aqueous solution of water soluble resins. Preferred water soluble resins non-exclusively include alkyl ethers of cellulose, polyvinyl alcohols and polyvinyl pyrrolidone. The release properties of the layer can be controlled by the incorporation of a water soluble surfactant. Preferred surfactants non-exclusively include alkylarylpolyether alcohols, glycerin and ethoxylated castor oil. In the preferred embodiment, the surfactant is present in the release layer in the amount of 0.1–5% by weight of solids in the layer, more preferably 0.5–2%. Other ingredients may be added such as mold inhibitors, anti-halation dyes, filter dyes, solvents, wetting agents, etc.

Adjacent to the release layer is coated the photosensitive color layer which typically comprises a photopolymerizable oligomer, colorant, initiator system, binders and other optional components such as wetting agents, surfactants, coating rheology modifiers, optical brighteners, plasticizers, residual solvents, etc. The photosensitive color layer is coated onto the releasable surface of the carrier using a mixture of solvents which give rise to the best coating quality and solution stability. Representative solvents include ketones, alkyl ethers or acetates of propylene glycol, alkyl ethers or acetates of ethylene glycol, dioxolane, butyrolactone, and alcohols.

The photopolymerizable oligomer comprises a multifunctional acrylate whose function is to form a high molecular weight polymer upon initiation by light generated radicals. The molecular weight of the acrylated oligomer influences several performance characteristics of the final coated film such as the tack of the coated film, the strength of the developer necessary to develop the image and the quality of the image attained. If the film imparts too much tack then it is difficult to manufacture the material in a production coating process without disruption of the film. This would give rise to poor coating quality. The strength of the developer required to develop the image is directly proportional to the molecular weight of the oligomer and the acid content of oligomer. Oligomers with lower molecular weights and high acid content are easier to develop and therefore do not need very aggressive developers. However, too much acid content or too high a molecular weight can cause destabilization of the pigment dispersions when acidic binders are used to disperse the pigments. When a low molecular weight oligomer such as Epoxy oligomer #1 (hereinafter described) is incorporated into the photosensitive color layer, the developability is increased so that a photosensitive barrier is not necessary; however, the tack of this film is very high, thus making the film impractical to coat on most production coaters. The film generated can be developed in a developer with low solids (3%) and low pH (8.1). Example 1 describes the use of Epoxy oligomer #2 (hereinafter described) which has a higher molecular weight and thus more acceptable tack; but requires a photosensitive barrier layer to achieve the optimum performance for developability and image quality with a developer comprising low solids (3%) and a pH of 10.2. Compositions of acrylated epoxy oligomers can be altered to achieve a balance between tack, developability and solution stability through the molecular weight of the material and the acid/amine content of the material. The preferred acrylated epoxy oligomer to achieve a coating which has acceptable tack has a mean molecular weight range of 2,400 to 5,000 and more preferably in the range of 2,400 to 3,500; and is present in the composition in the amount of 45–70% by weight (more preferably in the amount of 50–65%). Other acrylated oligomers which have shown utility include urethane oligomers as described in U.S. Pat. No. 4,304,923. An example of using urethane oligomer P-II is described in example 2 which can also be developed in a developer with low solids (2.1%) and a pH of 10.2. The preferred acrylated urethane oligomers to achieve a coating which has acceptable tack has a mean molecular weight range of 2,500 to 7,500 and more preferably in the range of 3,000 to 5,000; and is present in the composition in the amount of 45–70% by weight.

In the preferred embodiment, the photoinitiator(s) used must not generate a visible color change in the image or adhesive layers after exposure. Examples of photoinitiators non-exclusively include; triazines, acetophenones, benzophenones, and thioxanthones. The preferred photoinitiators include Irgacure TM 907(2-methyl-1-(4-(methylthio)phenyl)-2-(4-morpholinyl)-1-propane) from Ciba Geigy, Irgacure TM 369 from Ciba 5 Geigy, Quantacure TM ITX(isopropylthioxanthone) from Biddle Sawyer and triazines tethered to alkylarylpolyether alcohols (see U.S. patent application Ser. No. 07/752,775, filed Aug. 30, 1991, bearing U.S. attorney's docket number 47574USA4A titled "Light-Sensitive Article containing Non-Migrating Halomethyl-1,3,5-Triazines") and are present in the composition in the amount of 1.0–15% by weight. The optimum amount of initiator will be dependent upon the oligomer type used and the filtering effect of the pigment used.

Pigments or dyes may be used as colorants in the photosensitive color layer; however, pigments are preferred since they have a lower tendency for migration between the layers. The pigments are generally introduced into the photosensitive formulation in the form of a millbase comprising the pigment dispersed with a binder and suspended into a solvent or mixture of solvents. Many different pigments are available and are well known in the art. The pigment type and color are chosen such that the coated colored element is matched to a preset color target or specification set by the industry. Other colorants useful in the inventions include fluorescent and metallic materials as mentioned in "Paint and surface coatings: Theory and Practice" R. Lanbourne, Editor, Hasted Press, 1967 pages 183 to 185, These colorants can be used either alone or in combination with the above pigments to produce proofs when these effects are desired. The type of dispersing resin and the pigment to resin composition ratio chosen are dependent upon the pigment type, surface treatment on the pigment, dispersing solvent and milling process. Some examples of resins suitable for generating millbases which are compatible with the aforementioned photo-oligomers non-exclusively include; Polyvinyl acetate/crotonic acid copolymers, styrene maleic anhydride half esters resins, acrylic and methacrylic polymers and copolymers, polyvinyl acetals, polyvinyl acetals modified with anhydrides and amines, hydroxy alkyl cellulose resins and styrene acrylic resins. The primary composition of the dispersing resin is an acidic resin; however, some non-acidic resins may be present. In some combinations a dispersing agent may be necessary to achieve optimum dispersion quality. Some examples of dispersing agents non-exclusively include; polyester/polyamine copolymers, Disperse Aids TM from Daniels, PKE 1370 polyester resin from Biddle Sawyer, alkylarylpolyether alcohols, and acrylic resins. Other components may also be included in the millbase such as surfactants to improve solution stability, fluorescent materials, optical brighteners, UV absorbers, fillers, etc. The preferred composition of the millbase solids comprises 30–71% by weight pigment, 15–30% by weight acidic resin, 0–25% non-acidic resin, 0–20%, more preferably 0–10% dispersing agents. Additional binders may also be included in the photosensitive color formulation to balance developability and tack. Some examples of additional binders which are compatible with the aforementioned photo-oligomers and millbases non-exclusively include; Polyvinyl acetate/crotonic acid copolymers, styrene maleic anhydride half esters resins, acrylic and methacrylic polymers and copolymers, polyvinyl acetals, polyvinyl acetals modified with anhydrides and amines, and styrene acrylic resins. In the preferred composition of the photosensitive color layer, the pigment is present in the amount of 5–20% by weight, the acidic resin in the amount of 10–20% by weight and non-acidic resin in the amount of 0–5% by weight.

Coated adjacent to the photosensitive color layer is the photopolymerizable barrier layer. The photopolymerizable barrier layer is present to prevent interaction between the color layer and adhesive, and improves developability of the non-image areas. As previously discussed, this layer may be optional if the photosensitive color layer contains a photo-oligomer system which is low in molecular weight and has high developability. However, when photo-oligomer systems are used which reduce the tack of the color layer, the optimum performance of the element can be achieved if the photopolymerizable barrier is incorporated into the construction. The composition of the photopolymerizable barrier layer comprises an ethylenically unsaturated compound which can form a higher molecular weight polymer upon photochemical radical initiation, an acidic binder and a photoinitiator. Preferred examples of ethylenically unsaturated compounds non-exclusively include acrylated epoxy oligomers acrylated urethane oligomers as described in U.S. Pat. No. 4,304,923, Echo Resin ™ TAE 310(Triacrylated aromatic epoxide) and Dynacoll ™ A 6083 (acrylated copolyester available from Huls) and are present in the composition in the amount of 50–65%. Preferred binders non-exclusively include; polyvinyl acetate/crotonic acid copolymers, styrene maleic anhydride half esters resins, acrylic and methacrylic polymers and copolymers, acidified polyvinyl acetals, and styrene acrylic resins and are present in the composition in the amount of 30–50%. Preferred photoinitiators non-exclusively include; Irgacure ™ 907, Quantacure ™ ITX (isopropylthioxthone) and triazines tethered to alkylarylpolyether alcohols and are present in the composition in the amount of 1–10% by weight. The thickness is generally between 0.15 and 2.0 g/m$^2$, preferably between 0.2 and 1.0 g/m$^2$ dry weight of the entire layer. This is about 0.15 to 2.0 micrometers in thickness.

Coated adjacent to the photopolymerizable barrier is the thermal adhesive layer. The thermal adhesive layer provides a means of laminating the element to a substrate under heat and pressure. The solvent used for this coating must not attack or interact with the adjacent layer. Examples of solvents include alcohols, water and hydrocarbon solvents. Because hydrocarbon solvents like heptane and naphtha are prone to irregular coating patterns, production is very difficult, more polar solvents such as water and alcohols are preferred. Some examples of thermal resins which may be used include; vinyl acetate polymers and copolymers, acrylic and methacrylic polymers, copolymers and terpolymers, polyvinylacetals and acrylamide copolymers and terpolymers. Vinyl acetate polymers have been found to be very sensitive to moisture and can cause blocking of the coated materials in shipment and storage if the vinyl acetate component of the adhesive is present at amounts greater than 20%. The preferred thermoplastics resins non-exclusively include; copolymers of vinyl acetate which contain less than 20% vinyl acetate, Wallpol ™ 40165 available from Reichhold (terpolymer of vinyl acetate/methyl methacrylate/butyl acrylate), Synthemul ™ 97-603 available from Reichhold (terpolymer of N-(hydroxymethyl) acrylamide/butyl acrylate/methyl methacrylate), and copolymers of alkyl acrylates and alkyl methacrylates. Other additives may be present to aid in coating and performance such as surfactants, coalescence aids, plasticizers, polymethacrylate beads (as described in U.S. Pat. No. 4,885,225), silica, polyethylene waxes, optical brighteners, UV absorbers, etc.

Developer solutions used to develop the image after exposure are typically comprised of a combination of Sodium or Potassium carbonate, and Sodium or Potassium bicarbonate and a surfactant. In the preferred embodiment the carbonate concentration is in an amount 0.5–2% by weight, the bicarbonate concentration is in the amount 0–1% by weight, and the surfactant concentration is in the amount 0.1–1% by weight of the total developer solution and the balance is water. The preferred surfactants non-exclusively include; Surfynol ™ 465 (ethoxylated tetramethyl decynediol), Air Products; Surfactol ™ 365 (ethoxylated castor oil), CasChem; Triton X-100 (octylphenoxypolyethoxyethanol) and Surfynol ™ GA (acetylenic diols compounded with other non-ionic surfactants and solvents), Air Products.

Where the photosensitive layer contains a dispersing or binder resin which is an amine salt of an acid polymer (e.g., based upon acrylic acids and the like), the background areas (where the basic photopolymer layer has been resistively removed by wash off development) will have a lower pH than the color areas. By selecting a pH indicating dye which is colored and uncolored at the different surface pH levels of the two areas, a contrasting image can be provided quickly and easily. The pH sensitivity zones of indicating dyes is well reported in the literature and many different dyes can be selected. One may choose a dye to be colored at only higher pH levels, or choose a dye which is colored at only lower pH levels. It is generally preferred to select a dye which is colored at only higher pH levels in negative or positive systems. One could, however, use a dye which is only colored at lower pH levels in negative or positive acting systems (where an acid polymer medium is used) so that the color of the dye is present in the background areas or on top of the color image, providing a contrast with the yellow color of the image or the background areas of the image. Acid base indicators (also referred to in the art as pH indicators) are well reported in the literature, such as for example, *CRC Handbook of Chemistry and Physics*, Robert C. Weast, CRC Press, Inc., Boca Raton, Fla., 1988, pp. D-147-D-148. Particularly useful indicator dyes include Tetrabromophenolphthaleinethyl ester K salt, 3',3'',5',5''-tetrabromophenolsulfonephthalein (Bromophenol Blue), 3',3'',5',5''-tetrabromo-m-cresolsulfonephthalein (Bromocresol Green), Resazurin, and Lacmoid. These dyes become colored or change color at pH levels below 7.0 and are readily placed into solution that can be applied to imaged surfaces. If the background area is non-ionic, the selection of an acidic or basic image area simplifies the differentiation between the two areas.

As previously indicated, these dyes can be applied to the imaged materials in solution in any convenient fashion such as a brush, roller, marking pen (e.g., felt tip pen), or wiped on with a cloth. These and other aspects of the present invention can be seen in the following non-limiting examples.

EXAMPLES

Example 1

The following oxygen barrier/release layer coating solution was coated and dried to achieve a dry coating weight of 0.8 g/m$^2$ onto 2 mil (0.05 mm) polyester film;

| OXYGEN BARRIER/RELEASE SOLUTION | |
|---|---|
| | (% by Weight) |
| Vinol ® 205 Polyvinyl alcohol | 5.6 |
| Vinol ® 107 Polyvinyl alcohol | 2.4 |
| Triton ® X-100 non-ionic surfactant | 0.2 |
| Kathon ® CG/ICP Preservative | 0.09 |
| D.I. Water | 91.7 |

Vinol ® 205 and Vinol ® 107 are available from Air Products
Triton ® X-100 is available from Rohm and Haas
Kathon ® CG/ICP is available from Rohm and Haas The following pigment millbases were prepared for incorporation into the photosensitive color coating solution;

| MILLBASE COMPOSITIONS (% by Weight) | | | | |
|---|---|---|---|---|
| | Green Shade Yellow | Red Shade Magenta | Green Shade Cyan | Black |
| Mobay Pigment YB-5785 | 12.0 | | | |
| Sun Magenta Pigment 234-0071 | | 12.0 | | |
| Sun Cyan Pigment 249-0592 | | | 12.0 | |
| Columbia Black Pigment Raven ® 760 | | | | 18.0 |
| Acidified Butvar ® B-98* | 8.0 | 8.0 | 8.0 | 12.0 |
| Methyl ethyl ketone | 56.0 | 56.0 | 56.0 | 50.0 |
| Propylene glycol mono methyl ether | 24.0 | 24.0 | 24.0 | 20.0 |

*Acidified Butvar ® B-98 = Butvar ® B-98 modified with succinic Anyhydride and triethylamine (see U.S. Pat. application Ser. No. 07/716,317, filed June 17, 1991).

The following photosensitive color coating solutions were coated and dried to a reflection optical density representative of the color specifications for each industry color target onto the previously coated oxygen barrier/release layer;

| PHOTOSENSITIVE COLOR SOLUTIONS (% by Weight) | | | | | |
|---|---|---|---|---|---|
| | % Solids | YELLOW | MAGENTA | CYAN | BLACK |
| Green Shade Yellow Millbase | 20 | 11.1 | | | |
| Red Shade Magenta Millbase | 20 | | 13.6 | | |
| Green Shade Cyan Millbase | 20 | | | 6.9 | |
| Black Millbase | 30 | | | | 10.7 |
| Acidified Butvar ® B-98 | | 1.64 | 2.1 | 1.8 | 2.4 |
| Epoxy Oligomer #2 | | 5.28 | 6.5 | 4.7 | 7.5 |
| Irgacure ® 907 | | 0.84 | 0.7 | 0.9 | 1.2 |
| Quantacure ® ITX | | 0.51 | 0.4 | 0.5 | 0.7 |
| MEK | | 80.6 | 76.7 | 85.2 | 77.5 |

Epoxy Oligomer #2 = Oligomer of pentaerythritol triacrylate & succinic anhydride/EPON ™ 1001 (diglycidyl ether of bisphenol A)/0.45 succinic anhydride and triethylamine/1.5 diethanolamine
Acidified Butvar ® B-98 = Butvar ® B-98 modified with succinic anhydride and triethyl amine (as described in U.S. Pat. application Ser. No. 07/716,317)
Irgacure ® 907 (2-Methyl-1-(4-(methylthio)phenyl-2-(4-morpholinyl)-1-propane) available from Ciba-Geigy
Quantacure ® ITX (Isopropyl thioxanthone) available from Biddle Sawyer The following photopolymerizable barrier coating solution was coated and dried to a dry coating weight of 0.65 g/m² onto the previously coated photosensitive color layer;

| PHOTOSENSITIVE BARRIER SOLUTION | |
|---|---|
| | (% by Weight) |
| Epoxy Oligomer #2 | 6.2 |
| Acidified Butvar ® B-98 | 2.4 |
| Irgacure ® 907 | 1.2 |
| Quantacure ® ITX | 0.2 |
| MEK | 90.0 |

Epoxy Oligomer #2 = Oligomer of pentaerythritol triacrylate & succinic anhydride/EPON ® 1001 (diglycidyl ether of bisphenol A)/0.45 succinic anhydride and triethylamine/1.5 diethanolamine epoxy.
Acidified Butvar ™ B-98 = Butvar ™ B-98 modifed with succinic anhydride and triethyl amine (as described in U.S. Ser. No. 07/716,317 above.)
Irgacure ™ 907 (2-Methyl-1-(4-(methylthio)phenyl-2-(4-morpholinyl)-1-propane) available from Ciba-Geigy
Quantacure ® ITX (Isopropyl thioxanthone) available from Biddle Sawyer The following thermal adhesive coating solution was coated and dried to achieve a dry coating weight of 4.3 g/m² onto the previously coated photopolymerizable barrier layer;

| THERMAL ADHESIVE SOLUTION | | |
|---|---|---|
| | (% Solids) | (% by Weight) |
| Reichold Wallpol ® 40-100* | 45.5 | 77.6 |
| D.I. Water | | 22.2 |
| MA-8 PMMA Beads | 30.0 | 0.2 |

*Wallpol ® 40-100 (vinyl acetate latex adhesive) available from Reichhold. The PMMA bead composition is described in U.S. Pat. No. 4,885,225

The multicolored proof using the four process color films was imaged and developed as described in the summary. The following developer composition was used to develop the image;

| DEVELOPER SOLUTION | |
|---|---|
| | (% by Weight) |
| Potassium Carbonate | 1.0 |
| Potassium Bicarbonate | 1.0 |
| Surfynol ® GA* | 1.0 |
| Water | 97.0 |

*Surfynol ® GA (acetylenic diols compounded with other non-ionic surfactant and solvents) available from Air Products Example 2

The following oxygen barrier/release layer coating solution was coated and dried to achieve a dry coating weight of 0.8 g/m² onto 2 mil (0.05 mm) polyester film;

| OXYGEN BARRIER/RELEASE SOLUTION | |
|---|---|
| | (% by Weight) |
| Vinol ® 205 Polyvinyl alcohol | 5.6 |
| Vinol ® 107 Polyvinyl alcohol | 2.4 |
| Triton ® X-100 non-ionic surfactant | 0.2 |
| Kathon ® CG-ICP | 0.09 |
| D.I. Water | 91.7 |

Vinol ™ 205 and Vinol ™ 107 are available from Air Products
Triton ™ X-100 is available from Rohm and Haas
Kathon ™ CG/ICP is available from Rohm and Haas The following pigment millbases were prepared for incorporation into the photosensitive color coating solution;

| MILLBASE COMPOSITIONS (% by Weight) | | | |
|---|---|---|---|
| Green Shade | Red Shade | Red Shade | Blue Shade |

-continued

| MILLBASE COMPOSITIONS (% by Weight) | | | | |
| --- | --- | --- | --- | --- |
| | Yellow | Yellow | Magenta | Magenta |
| Mobay Pigment YB-5785 | 11.6 | | | |
| Sun Yellow Pigment 275-0005 | | 11.6 | | |
| Sun Magenta Pigment 234-0071 | | | 11.2 | |
| Mobay Magenta Pigment RV-6803 | | | | 6.8 |
| Butvar ® B-98 | 2.7 | 2.7 | 1.5 | 2.3 |
| Joncryl ® 67 | 5.0 | 2.7 | 6.0 | 2.3 |
| Disperbyk ® 161 | 0.6 | 0.6 | 1.1 | 0.7 |
| FC-430 | 0.04 | 0.04 | 0.2 | 0.02 |
| Methyl ethyl ketone | 56.0 | 56.0 | 56.0 | 61.4 |
| Propylene glycol monomethyl ether | 24.0 | 24.0 | 24.0 | 26.6 |
| | Green Shade Cyan | | Red Shade Cyan | Black |
| Sun Cyan Pigment 249-0592 | 11.6 | | | |
| Sun Cyan Pigment 248-0615 | | | 11.6 | |
| Columbia Black Pigment Raven ® 760 | | | | 16.6 |
| Butvar ® B-98 | 3.9 | | 4.0 | 3.0 |
| Joncryl ® 67 | 3.9 | | 4.0 | 8.9 |
| Disperbyk ® 161 | 0.6 | | 0.6 | 1.5 |
| FC-430 | 0.04 | | 0.04 | 0.05 |
| Methyl ethyl ketone | 56.0 | | 56.0 | 50.0 |
| Propylene glycol monomethyl ether | 24.0 | | 24.0 | 20.0 |

Butvar ® B-98 (Polyvinyl butyryl) available from Monsanto
Joncryl ® 67 (Styrene acrylic resin) available from Johnson Wax
Disperbyk ® 161 available from Byk Chemie
FC-430 (fluorinated nonionic surfactant CAS# 11114-17-3) available from 3M Example 3

The following describes another imaging system that can be used with the practice of the present invention. A proofing element similar to that of the previous example was prepared except that the yellow coating layer comprised:

| Component | % Solids |
| --- | --- |
| U34 (Preparation IV of U.S. Pat. No. 4,304,923) | 56 |
| Acidified B-98 | 11 |
| TMM (preparation XVI of Ser. No. 07/752,775, filed August 30, 1991) which is an s-triazine photoinitiator | 5.9 |
| Joncryl 67 | 13 |
| Butvar B-98 | 2.5 |
| Disperbyk 161 | 0.53 |
| FC-430 (fluorinated oligomeric surfactant) | 0.04 |
| FC 55/35/10 (a fluorinated polymeric surfactant) | 0.43 |
| and a yellow pigment (Sun 275-0005) | 1.9 |
| Harshaw 1270 | 7.3 |
| Hoechst 11-120066 | 1.4 |
| Raven 760 | 0.08 |

After coating, exposure and development of this material (in a developer composition comprising 1% potassium carbonate, 1% potassium bicarbonate, 0.1% Surfonyl 465 (Air Products, Inc.), and 97.9% water), a soft tip pin containing a solution of indicator dye was applied over the imaged area. The yellow areas were converted to a green-blue color by the difference in pH, while the background area remained white. The indicator dye solution in the pen comprised bromophenol blue (0.1 g) in methanol (6.0 g) and polyvinylpyrrolidone (GAF, K-90) as 15% binder in methanol (2.0 g). This solution was filled into the ink reservoir of a bullet tipped marking pen assembly. The registration mark of the image (off the area of the main image) was marked over with the stroke of the pen. The yellow image area turned blue which provided a much higher visibility (more highly contrasted) registration mark.

What we claim is:

1. A method for locally enhancing the contrast of a yellow image, which method comprises providing a yellow image on a white background, said image comprised of yellow areas and white areas, said yellow areas and white areas exhibiting pH levels which differ by at least 0.5 in an aqueous environment, applying to at least a portion of said yellow image a solution of a pH color changing dye which will change color to a color other than yellow when coated on one of said yellow areas or white areas and not change color when coated on the other of said yellow areas or white areas, thereby forming a colored image duplicating the yellow image in areas where the solution has been applied, said colored image having a visually better contrast than said yellow image.

2. The method of claim 1 wherein said yellow areas comprise a basic layer.

3. The method of claim 1 wherein said white areas comprise an area which is non-ionic.

4. The method of claim 1 wherein said solution comprises a pH indicating dye which is a color other than yellow when at a pH greater than 7.0.

5. The method of claim 2 wherein said solution comprises a pH indicating dye which is a color other than yellow at a pH of greater than 7.0.

6. The method of claim 1 wherein said solution comprises a dye which becomes a color other than yellow at a pH of less than 7.0.

7. The method of claim 2 wherein said solution comprises a dye which becomes a color other than yellow at a pH of less than 7.0.

8. The method of claim 1 wherein the yellow image comprises a yellow surprint proofing element with a yellow image thereon.

9. The method of claim 8 wherein said yellow surprint proofing element comprises photosensitive diazo oxides or photopolymers.

10. The method of claim 2 wherein the yellow image comprises a yellow surprint proofing element with a yellow image thereon.

11. The method of claim 2 wherein said yellow surprint proofing element comprises photosensitive diazo oxides or photopolymers.

12. The method of claim 3 wherein the yellow image comprises a yellow surprint proofing element with a yellow image thereon.

13. The method of claim 3 wherein said yellow surprint proofing element comprises photosensitive diazo oxides or photopolymers.

14. The method of claim 4 wherein the yellow image comprises a yellow surprint proofing element with a yellow image thereon.

15. The method of claim 4 wherein said yellow surprint proofing element comprises photosensitive diazo oxides or photopolymers.

16. The method of claim 5 wherein the yellow image comprises a yellow surprint proofing element with a yellow image thereon.

17. The method of claim 5 wherein said yellow surprint proofing element comprises photosensitive diazo oxides or photopolymers.

18. The method of claim 6 wherein the yellow image comprises a yellow surprint proofing element with a yellow image thereon.

19. The method of claim 6 wherein said yellow surprint proofing element comprises photosensitive diazo oxides or photopolymers.

* * * * *

UNITED STATES PATENT AND TRADEMARK OFFICE
CERTIFICATE OF CORRECTION

PATENT NO. : 5,310,627
DATED : May 10, 1994
INVENTOR(S) : Hirz et al.

It is certified that error appears in the above-indentified patent and that said Letters Patent is hereby corrected as shown below:

Column 5, line 49, delete "Ciba 5 Geigy"
and insert --Ciba Geiby--.

Signed and Sealed this

Sixth Day of September, 1994

Attest:

BRUCE LEHMAN

Attesting Officer

Commissioner of Patents and Trademarks